United States Patent [19]

Lee

[11] Patent Number: 4,933,642
[45] Date of Patent: Jun. 12, 1990

[54] CMOS CHOPPER-STABILIZED OPERATIONAL AMPLIFIER USING TWO DIFFERENTIAL AMPLIFIER PAIRS AS INPUT STAGES

[75] Inventor: Minru Lee, San Jose, Calif.

[73] Assignee: Linear Technology Corporation, Milpitas, Calif.

[21] Appl. No.: 312,691

[22] Filed: Feb. 17, 1989

[51] Int. Cl.⁵ .............................. H03F 1/02; H03F 1/14
[52] U.S. Cl. ............................................ 330/9; 330/51
[58] Field of Search ................... 330/9, 51, 84, 124 R, 330/252, 295; 307/491, 494, 497

[56] References Cited

U.S. PATENT DOCUMENTS 3,988,689 10/1976 Ochi et al. ...................... 330/51 X
4,622,521 11/1986 Redfern .

FOREIGN PATENT DOCUMENTS 0564709 7/1977 U.S.S.R. ................................ 330/9

OTHER PUBLICATIONS

"A Versatile Building Block: The CMOS Differential Difference Amplifier," IEEE Jrnl of Solid-State Circuits, vol. SC22, No. 2, pp. 287 et seq.
ICL7650 Chopper Stabilized Operational Amplifier Specifications Intersil, Inc.
Application Considerations and Circuits for a New Chopper-Stabilized Op Amp (Appln. Note 9), Linear Technology Corp. Mar. 1985.

*Primary Examiner*—Steven Mottola
*Attorney, Agent, or Firm*—Flehr, Hohbach, Test, Albritton & Herbert

[57] ABSTRACT

A CMOS chopper-stabilized operational amplifier including a nulling amplifier and a main amplifier has a pair of two input differential amplifiers in the input stage of each of the nulling amplifier and the main amplifier. In the nulling amplifier, one two-input differential amplifier switchably receives the input signals to the chopper stabilized operational amplifier, while the other two input differential amplifier functions in a feedback loop for developing a nulling voltage for the DC offset of the first two input differential amplifier. The operational amplifier has a three-phase clock and samples through a nulling time period, a setting time period, and a sampling time period.

14 Claims, 2 Drawing Sheets

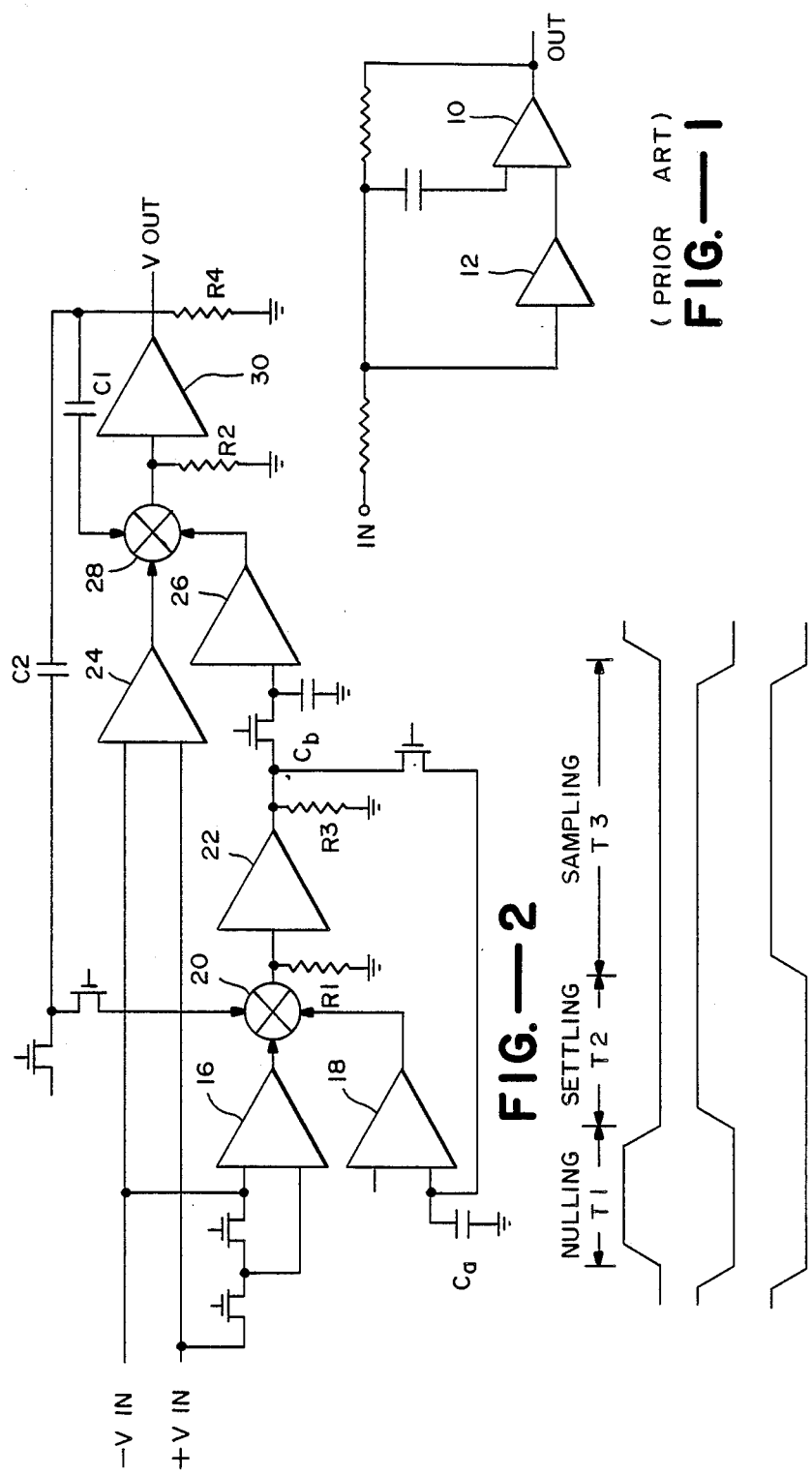

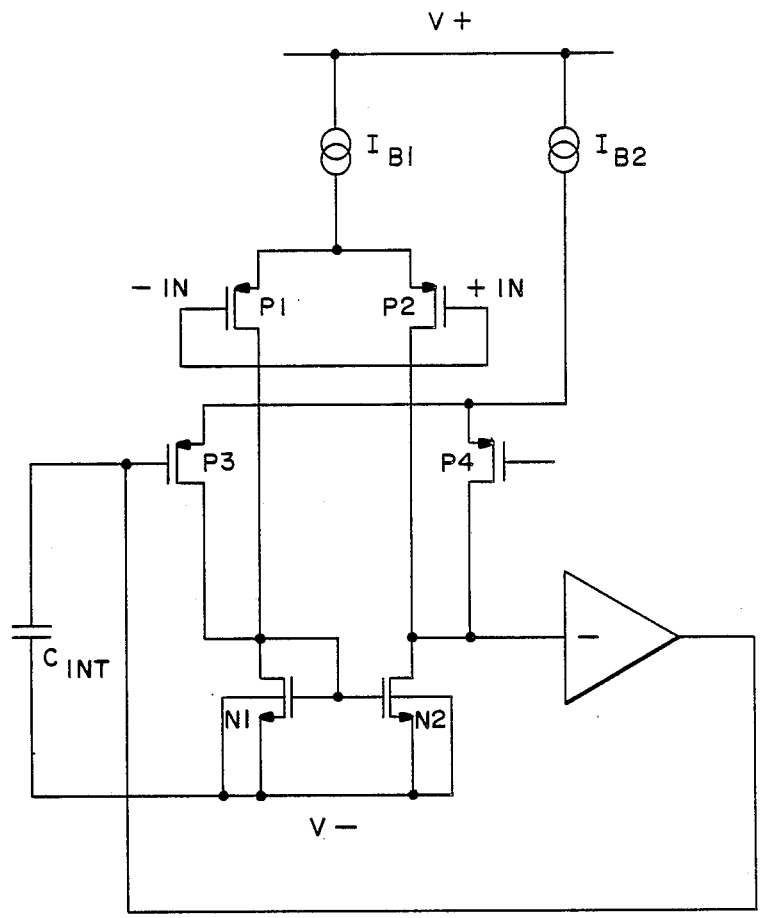
FIG.—4

CMOS CHOPPER-STABILIZED OPERATIONAL AMPLIFIER USING TWO DIFFERENTIAL AMPLIFIER PAIRS AS INPUT STAGES

BACKGROUND OF THE INVENTION

This invention relates generally to CMOS chopper stabilized operational amplifiers, and more particularly the invention relates to such an operational amplifier which utilizes two pairs of differential amplifiers as input stages.

The chopper amplifier achieves high DC stability by converting the DC input into an AC signal. An AC gain stage amplifies this signal. After amplification it is converted back to DC and presented as the amplifier's output. The AC amplifier's input is alternately switched between the signal input and the feedback divider network. The AC amplifier's output amplitude represents the difference between the feedback signal and the circuit's input. This output is converted back to DC by a phase-sensitive demodulator composed of a second switch, synchronously driven with the input switch. The output integrator stage smoothes the switch output to DC and presents the final output. Drifts in the output integrator stage are of little consequence because they are preceded by the AC gain stage. The DC drifts in the AC stage are also irrelevant because they are isolated from the rest of the amplifier by the coupling capacitors. Overall DC gain is extremely high, being the product of the gains of the AC stage and the DC gain of the integrator.

The classic chopper-stabilized amplifier solves the chopper amplifier's low bandwidth problem. It uses a parallel path approach to provide wider bandwidth while maintaining good DC characteristics. The stabilizing amplifier, a chopper type, biases the fast amplifier's positive terminal to force the summing point to zero. Fast signals directly drive the AC amplifier, while slow ones are handled by the stabilizing chopper amplifier. The low-frequency cut-off of the fast amplifier must coincide with the high-frequency roll-off of the stabilizing amplifier to achieve smooth overall gain-frequency characteristics.

The conventional bipolar operational amplifier requires component matching to insure low input errors, while the conventional CMOS chopper stabilized operational amplifier has circuitry to compensate component offset. In compensating the component offset, sampled data techniques are employed to periodically short the two inputs and close a loop around an amplifier to force the input error to zero. The error correction voltage is capacitively stored and provides a bias voltage to an input stage. Both the main amplifier and the nulling amplifier have offset null capability. The main amplifier is continuously connected from the input to the output, while the nulling amplifier under the control of the chopping frequency oscillator and clock circuit alternately nulls itself and the main amplifier.

Redfern, U.S. Pat. No. 4,622,521 discloses a chopper-stabilized operational amplifier in which improved operation of the nulling amplifier is achieved by providing transistors in parallel with load transistors of a differential amplifier. An offset correction voltage is applied to one of the transistors and thereby modifies the load.

SUMMARY OF THE INVENTION

The present invention is directed to a chopper stabilized amplifier including a nulling amplifier and a main amplifier in which the input stage of each of the amplifiers uses a differential amplifier pair in developing offset correction voltages which are capacitively stored.

The amplifier has three phase clock operation during nulling, settling, and sampling time periods. One differential pair in the input stage of the nulling amplifier develops a DC offset voltage while the inputs to the other differential amplifier of the pair are shorted. The DC offset voltage is then utilized in the settling phase to offset the DC bias of the nulling amplifier while the input signal is applied. Following the settling time period when the internal nodes of the nulling amplifier have settled, the nulling amplifier provides a correction voltage for the main amplifier.

In an alternative embodiment either the main amplifier or the nulling amplifier can have a pair of differential amplifiers as an input stage while the other amplifier has a conventional input stage such as shown in Redfern U.S. Pat. No. 4,622,521, supra.

In accordance with a feature of the invention, each of the input stages comprises a first pair of transistors which forms a first input differential amplifier input. A second pair of transistors forms a second differential amplifier input to null out offset voltage of the first pair. Another pair of transistors provides the input stage active load for both pairs of transistors.

In accordance with another feature of the invention the transconductances of the transistors in each differential amplifier pair are unequal to minimize noise.

The invention and objects and features thereof will be more fully understood from the following detail description and the appended claims taken with the drawing.

BRIEF DESCRIPTION OF THE DRAWINGS

FIG. 1 is a schematic diagram of a conventional chopper-stabilized amplifier.

FIG. 2 is a schematic of a chopper-stabilized operational amplifier in accordance with one embodiment of the present invention.

FIG. 3 illustrates timing diagrams in the operation of the amplifier of FIG. 2.

FIG. 4 is a simplified schematic of the input stage of the nulling amplifier and feed forward amplifier in the circuit of FIG. 2.

DETAILED DESCRIPTION OF THE ILLUSTRATED EMBODIMENTS

FIG. 1 is a schematic of a conventional chopper-stabilized amplifier including a main amplifier 10 and a nulling amplifier 12. The main amplifier is connected full time from the input to the output, while the nulling amplifier under control of the chopping frequency oscillator clock circuit (not shown) alternately nulls itself and the main amplifier. The parallel path approach provides wider bandwidth while maintaining good DC characteristics. The chopper type stabilizing amplifier 1 2 biases the positive terminal of the fast amplifiers to force the summing point to zero. Fast signals directly drive the amplifier 10, while slow signals are handled by the stabilizing chopper amplifier 12.

FIG. 2 is a schematic of a chopper stabilized operational amplifier in accordance with one embodiment of the present invention. In this embodiment the nulling amplifier comprises two differential amplifiers 16 and 18 with the outputs thereof summed at 20 to drive amplifier 22. Similarly, the main amplifier includes a pair of two input differential amplifiers 24 and 26 whose outputs are summed at 28 and applied to drive amplifier 30. In the nulling amplifier, amplifier 18 compensates for DC offset in amplifier 16 driving amplifier 22. Similarly, in the main amplifier, the amplifier 26 compensates for DC offset in amplifier 24 driving amplifier 30.

Amplifier 24 of the main amplifier is connected to receive the two input signals, $+V_{in}$ and $-V_{in}$. The two-input differential amplifier 16 in the nulling amplifier receives the $+V_{in}$ input through switch S4 and can be periodically shorted by switch S3. The capacitor C2 is either connected to network 20 through switch S5 or connected to DC bia through switch S6.

Switch S1 periodically connects amplifier 18 in a feedback loop for developing a DC offset voltage for amplifier 16. Bias for the offset voltage is stored on capacitor $C_a$ at one input of amplifier 18 while the other input receives a DC bias $V_{B1}$.

The chopper stabilized amplifier of FIG. 2 operates with a three phase clock, comprising a nulling period (T1), a settling period (T2), and a sampling period (T3), as illustrated in FIG. 3. During the nulling phase T1 switches S1, S3, and S6 are closed while switches S2, S4, and S5 are open. Amplifiers 18 and 22 form a closed unity-gain auto-zeroing loop to null out nulling amplifier offset voltage. When the auto zeroing loop is opened for the following settling and sampling cycles, the offset correction voltage is stored in capacitor $C_a$. During the settling phase T2, switches S1, S2, S3, and S6 are opened, while switches S4 and S5 are closed. This period of time allows the nulling amplifier internal nodes to settle and be ready for the sampling phase, T3. During the sampling phase T3, switch S2 is closed to establish a high gain signal path consisting of amplifiers 16, 22, 26, and 30. Voltage on capacitor $C_b$ at one input of amplifier 26, the correction for the main amplifier offset, can be adjusted with an external feedback loop around the signal path.

Implementation of the input stages for the nulling amplifier and the main amplifier is illustrated in FIG. 4. The switches are removed to simplify the schematic for operation during the nulling time period. P-channel transistors P1 and P2 form the first input differential pair, for amplifier normal input. P-channel transistors P3 and P4 form the second differential pair to null out offset voltage of the first pair. N-channel transistors, N1 and N2, are the input stage active load for both pairs of p-channel transistors. During the nulling phase, gates of the transistors P1 and P2 are shorted together. The gate of transistor P4 is connected to bias voltage, and the gate of transistor P3, connected to a sample-and-hold capacitor $C_a$, is driven by the output of the second stage. If the amplifier is perfectly balanced the voltage stored on $C_a$ will be the same as the gate bias voltage of transistor P4. If amplifier offset voltage exists, the voltage stored on capacitor $C_a$ will be either above or below the bias voltage on the gate of transistor P4 to cancel amplifier offset voltage. When the voltage on capacitor $C_a$ is skewed with respect to the gate bias voltage on transistor P4, tail bias current IB2 divides unevenly between transistor P3 and P4 to compensate for current differences between transistors P1 and P2 due to the amplifier offset voltage. Voltage on capacitor $C_a$ can be skewed to the point where either P3 or P4 turns off and beyond this the amplifier can no longer be nulled. Therefore, the range of the amplifier offset of either polarity that can be nulled is determined by the bias current $I_{B2}$ divided by the amplifier transconductance.

In designing the transistors in the circuit of FIG. 4, the width-to-length ratio (W/L) of transistors P3 and P4 is significantly lower than that of transistors P1 and P2. Tail bias current $I_{B2}$ is much smaller than the current of $I_{B1}$. Both factors contribute to a much lower transconductance of transistors P3 and P4 than that of transistors P1 and P2, and this minimizes noise contribution of transistors P3 and P4 in the amplifier. Noise contribution can be further reduced by making transistors P3 and P4 intrinsic devices in the N type substrate in a p-well process. This has the advantage over prior art approaches that use noisier n-channel transistors in parallel with the active load as the feedback loading transistors. Capacitor size can be reduced significantly compared to external capacitors used by a conventional chopper-stabilized amplifier. This allows the process to be integrated on the chip and eliminates pins from the sample-and-hold capacitors and overcomes reliability problems associated with external components. Further, the use of small capacitors permits the second stage to run at a lower current to save power yet improves power turn-on, settling and overload recovery times.

To the first order approximation, bandwidth of both the nulling amplifier and the high gain signal path loop is given by the gain of transistor 18 times the gain of transistor 22 times the resistance of resistor R1 divided by the capacitance of capacitor $C_a$, assuming that G16 equals G24, G18 equals G26, and R1 equals R2. In reality, however, since the high gain signal path has many more active devices as well as parasitic capacitance than the nulling amplifier loop, bandwidth of the high gain loop is narrower than that of the nulling amplifier loop. In particular, phase margin of the high gain loop is much worse than the nulling amplifier. Consequently, a longer time is required for the sampling phase to allow the high gain loop to settle to the same accuracy limit of the nulling amplifier loop. The RC time constant of the settling phase is typically small in comparison to the nulling loop. To achieve the most efficient use of chopping cycle, the sampling phase is designed to have the longest duration while the settling phase has the shortest.

There has been described an improved chopper stabilized amplifier including a nulling amplifier and a main amplifier each having an input stage comprising a pair of differential amplifiers. While the invention has been described with reference to a specific embodiment, the description is illustrative of the invention and is not to be construed as limiting the invention. For example, either the main amplifier or the nulling amplifier can have a conventional input stage while the other amplifier has a pair of differential amplifiers as an input stage. Thus, various modifications and applications may occur to those skilled in the art without departing from the true spirit and scope of the invention as defined by the dependent claims.

I claim:

1. A CMOS chopper-stabilized operational amplifier comprising:
   first and second input terminals for receiving two input signals ($+V_{in}$, $-V_{in}$);
   a main amplifier having two input terminals for receiving input signals from said first and second input terminals;
   a nulling amplifier for developing a bias voltage for compensating offset voltage in said main amplifier and said nulling amplifier and including capacitive means for storing a null correction voltage;

said nulling amplifier means including a first pair of differential amplifiers as an input stage;

one differential amplifier of said first pair including two inputs and means switchably connecting said inputs together and switchably connecting said inputs to receive said two input signals;

the other differential amplifier of said first pair connected to said capacitive means.

2. The CMOS chopper-stabilized operational amplifier as defined in claim 1 wherein said main amplifier includes a second pair of amplifiers as an input stage, one differential amplifier of said second pair having two inputs and means connecting said inputs to receive said two input signals, the other differential amplifier of said second pair having one input connected to receive said bias voltage.

3. The CMOS chopper-stabilized operational amplifier as defined in claim 2 wherein operation of said amplifier includes a nulling time period, a settling time period, and a sampling time period, said amplifier operating with a three-phase clock.

4. The CMOS chopper-stabilized operational amplifier as defined in claim 3 wherein the settling time period is different from the sampling time period.

5. The CMOS chopper-stabilized operational amplifier as defined in claim 3 wherein said two inputs of said one differential amplifier of said first pair are connected together during a nulling time period and are connected to receive said two input signals during the settling time period and the sampling time period, said other differential amplifier of said first pair being connected in said feedback loop during the nulling time period.

6. The CMOS chopper-stabilized operational amplifier as defined in claim 5 wherein said one differential amplifier of said first pair comprises a first pair of field-effect transistors, said other differential amplifier of said first pair comprises a second pair of field-effect transistors, and a pair of opposite type field-effect transistors connected as a load for each of said first pair of field-effect transistors and said second pair of field-effect transistors.

7. The CMOS chopper-stabilized operational amplifier as defined by claim 6 wherein said first pair and said second pair of field-effect transistors are p-channel transistors and said pair of opposite type field-effect transistors are n-channel transistors.

8. The CMOS chopper-stabilized operational amplifier as defined in claim 6 wherein the width-to-length ratio of the channel of said second pair of field-effect transistors is lower than the width-to-length ratio of channel of the first pair of field-effect transistors.

9. The CMOS chopper-stabilized operational amplifier as defined in claim 8 wherein the transconductance of said first pair of field-effect transistors is different from the transconductance of said second pair of field-effect transistors.

10. The CMOS chopper-stabilized operational amplifier as defined in claim wherein said one differential amplifier of said first pair comprises a first pair of field-effect transistors, said other differential amplifier of said first pair comprises a second pair of field-effect transistors, and a pair of transistors connected as a load for each of said first pair of field-effect transistors and said second pair of field-effect transistors.

11. The CMOS chopper-stabilized operational amplifier as defined in claim 10 wherein the width-to-length ratio of the channel of said second pair of field-effect transistors is lower than the width-to-length ratio of channel of the first pair of field-effect transistors.

12. The CMOS chopper-stabilized operational amplifier as defined in claim 11 wherein the transconductance of said first pair of field-effect transistors is different from the transconductance of said second pair of field-effect transistors.

13. A CMOS chopper-stabilized operation amplifier comprising first and second input terminals for receiving two input signals $(+V_{IN}, -V_{IN})$;

a main amplifier having two input terminals connected directly to said first and second input terminals for continuously receiving input signals therefrom;

a nulling amplifier for receiving a bias voltage for compensating offset voltage in said main amplifier and including capacitive means for storing a null-correction voltage;

means for summing the outputs of said main amplifier and said nulling amplifier; and means for developing a bias voltage for said nulling amplifier.

14. A CMOS chopper-stabilized operation amplifier comprising first and second input terminals for receiving two input signals $(+V_{IN}, -V_{IN})$;

a main amplifier having two input terminals connected directly to said first and second input terminals for continuously receiving input signals therefrom;

a nulling amplifier for receiving a bias voltage for compensating offset voltage in said main amplifier and including capacitive means for storing a null-correction voltage;

means for summing the outputs of said main amplifier and said nulling amplifier; and chopper-amplifier means for developing a bias voltage for said nulling amplifier.

* * * * *

UNITED STATES PATENT AND TRADEMARK OFFICE
CERTIFICATE OF CORRECTION

PATENT NO. : 4,933,642

DATED : June 12, 1990

INVENTOR(S) : Minru Lee

It is certified that error appears in the above-identified patent and that said Letters Patent is hereby corrected as shown below:

At Column 6, Line 5, after the word "claim" insert --1--.

Signed and Sealed this

Twenty-fifth Day of August, 1992

*Attest:*

DOUGLAS B. COMER

*Attesting Officer*  Acting Commissioner of Patents and Trademarks